(12) United States Patent
Yen et al.

(10) Patent No.: US 7,601,466 B2
(45) Date of Patent: Oct. 13, 2009

(54) SYSTEM AND METHOD FOR PHOTOLITHOGRAPHY IN SEMICONDUCTOR MANUFACTURING

(75) Inventors: Yung-Sung Yen, Taipei County (TW); Kuei Shun Chen, Hsin-Chu (TW); Chia-Sui Hsu, Hsinchu (TW); Yuh-Sen Chang, Hsin-Chu (TW); Hsiao-Tzu Lu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 764 days.

(21) Appl. No.: 11/054,458

(22) Filed: Feb. 9, 2005

(65) Prior Publication Data
US 2006/0177778 A1    Aug. 10, 2006

(51) Int. Cl.
*G03F 1/00* (2006.01)
(52) U.S. Cl. .................. 430/5; 430/311; 430/394
(58) Field of Classification Search .............. 430/5, 430/394
See application file for complete search history.

(56) References Cited

U.S. PATENT DOCUMENTS

| 5,308,741 | A |   | 5/1994 | Kemp |
| 5,547,788 | A | * | 8/1996 | Han et al. ................. 430/5 |
| 6,022,644 | A | * | 2/2000 | Lin et al. ................... 430/5 |
| 6,190,840 | B1 | * | 2/2001 | Kawano et al. ......... 430/325 |
| 2003/0022112 | A1 | * | 1/2003 | Arifin et al. ............ 430/394 |
| 2004/0157135 | A1 | * | 8/2004 | Liu et al. .................... 430/5 |

* cited by examiner

*Primary Examiner*—Mark F Huff
*Assistant Examiner*—Stewart A Fraser
(74) *Attorney, Agent, or Firm*—Haynes and Boone, LLP

(57) ABSTRACT

A method for photolithography in semiconductor manufacturing includes providing a mask with first and second focus planes for a wafer. The wafer includes corresponding first and second wafer regions. The first wafer region receives a first image during a first exposure utilizing the first focus plane. The second wafer region receives a second image during a second exposure utilizing the second focus plane.

24 Claims, 6 Drawing Sheets

US 7,601,466 B2

SYSTEM AND METHOD FOR PHOTOLITHOGRAPHY IN SEMICONDUCTOR MANUFACTURING

CROSS-REFERENCE TO RELATED APPLICATIONS

This application is related to the U.S. patent application Ser. No. 11,054,458 entitled "METHOD OF IMPROVING VIA FILLING UNIFORMITY IN ISOLATED AND DENSE VIA-PATTERN REGIONS," which is hereby incorporated by reference in its entirety.

BACKGROUND

The present disclosure relates generally to the manufacturing of semiconductor devices, and more particularly to a photolithography process in semiconductor manufacturing.

Since the inception of the semiconductor industry, photolithography has been used for forming the components of integrated circuits. The continued increase in the density of components that can be placed on a chip has been largely due to advances in photolithography, and especially the ever decreasing wavelengths of radiation. As long as the critical dimension of the components is greater than the wavelength of the radiation used to expose the photoresist, advances in the art do not require any significant changes of the masks.

However, when the wavelength of the imaging radiation is larger than the critical dimension, the effects of diffraction, though always present, become sufficiently prominent to introduce noticeable distortions into the projected images. Those distortions are particularly sensitive to the distances between the various features in the image pattern and are frequently referred to as "proximity effects."

Another problem associated with photolithography at wavelengths close to the critical dimensions is depth of focus (DOF). In particular, when the DOF is less than the thickness of the resist being exposed, image sharpness will be lost. In practice, because of diffraction effects, the resulting image often becomes a blurred circle.

When resolution is not a concern, DOF can be increased by restricting the incoming light to the center of the lens, thus reducing the angle of the light cone so that focused rays travel further before leaving the blurred circle. However, when resolution is also a consideration, that solution is no longer acceptable.

Traditionally, approaches for increasing DOF have been directed toward bringing both densely packed and isolated contact holes into simultaneous focus. However, since the increase of DOF for densely packed contact holes often result in the decrease of the DOF for isolated contact holes, such efforts frequently result in unfocused images.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2b illustrates a partial view of a mask for use in the photolithography system of FIG. 2a.

DETAILED DESCRIPTION

Figure 1:
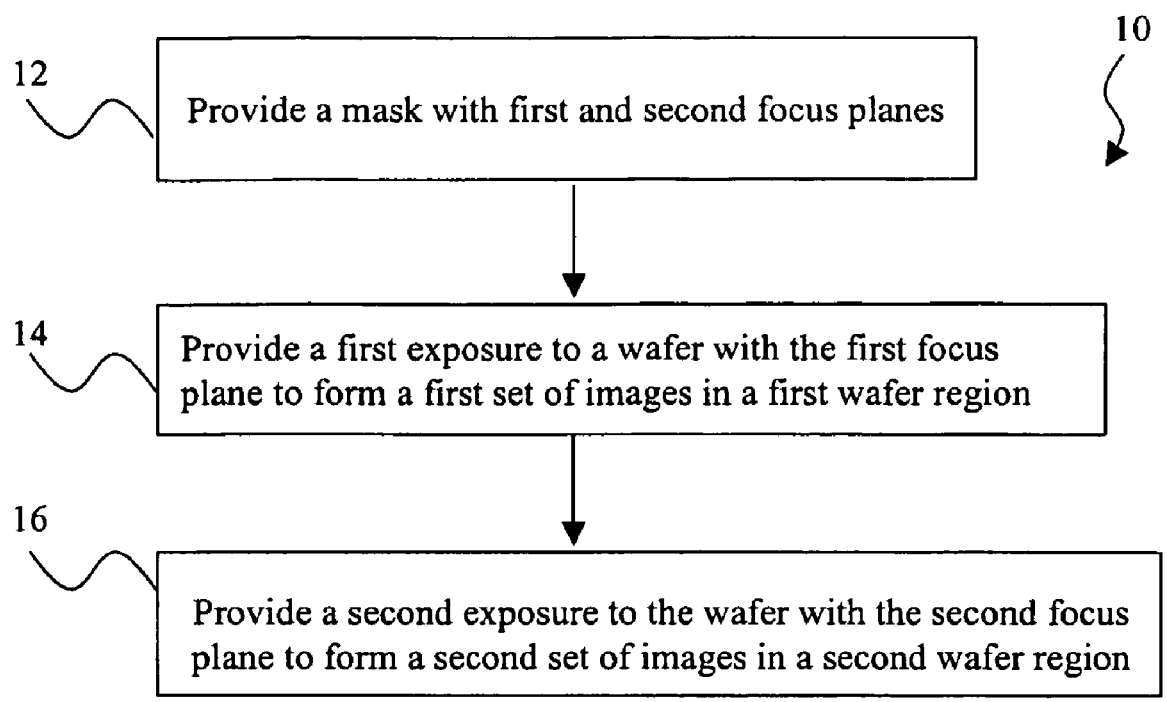
FIG. 1 illustrates a method of photolithography for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

To balance respective DOFs for densely packed and isolated contact holes, previously available art utilizes double masks with double exposures. Generally, a first mask is utilized for the densely packed contact holes, while a second mask is utilized for the isolated contacted holes.

However, it is costly to swap masks during the photolithography process. Further, the utilization of double masks may also result in overlay inaccuracy.

Therefore, it is desirable to utilize a single mask for double exposures to provide desirable images. As described further below, the present disclosure presents a single mask with two or more focus planes to accommodate different exposures.

Referring now to FIG. 1, shown therein is a simplified photolithography method 10 for implementing one or more embodiments of the present invention. The method initiates with step 12, which provides a mask with first and second focus planes. Pursuant to step 14, a first exposure is provided to a wafer with the first focus plane to form a first image in a first wafer region, and a second exposure is provided to the wafer with the second focus plane to form a second image in a second wafer region pursuant to step 16 of the method 10.

The method 10 may be utilized in the manufacturing of a variety of semiconductor devices, such as memory devices (including but not limited to a static random access memory (SRAM)), logic devices (including but not limited to a metal-oxide semiconductor field-effect transistor (MOSFET)), and/or other devices. The method 10 begins at step 12 wherein a unique mask is provided with multiple focus planes.

Figure 2B:
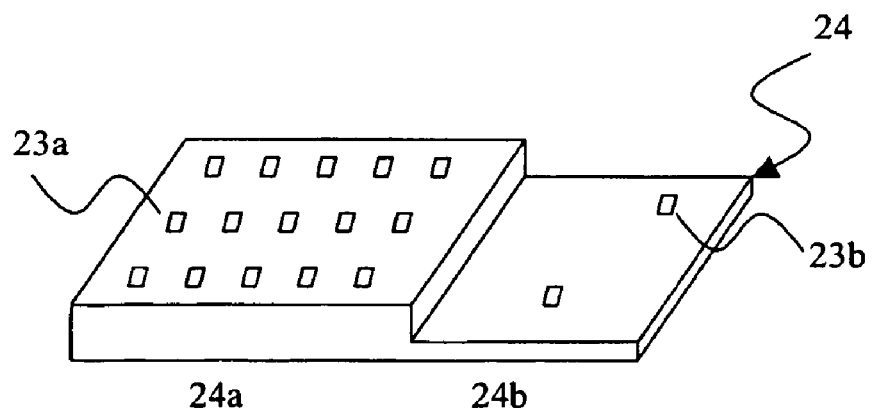
Figure 2A:
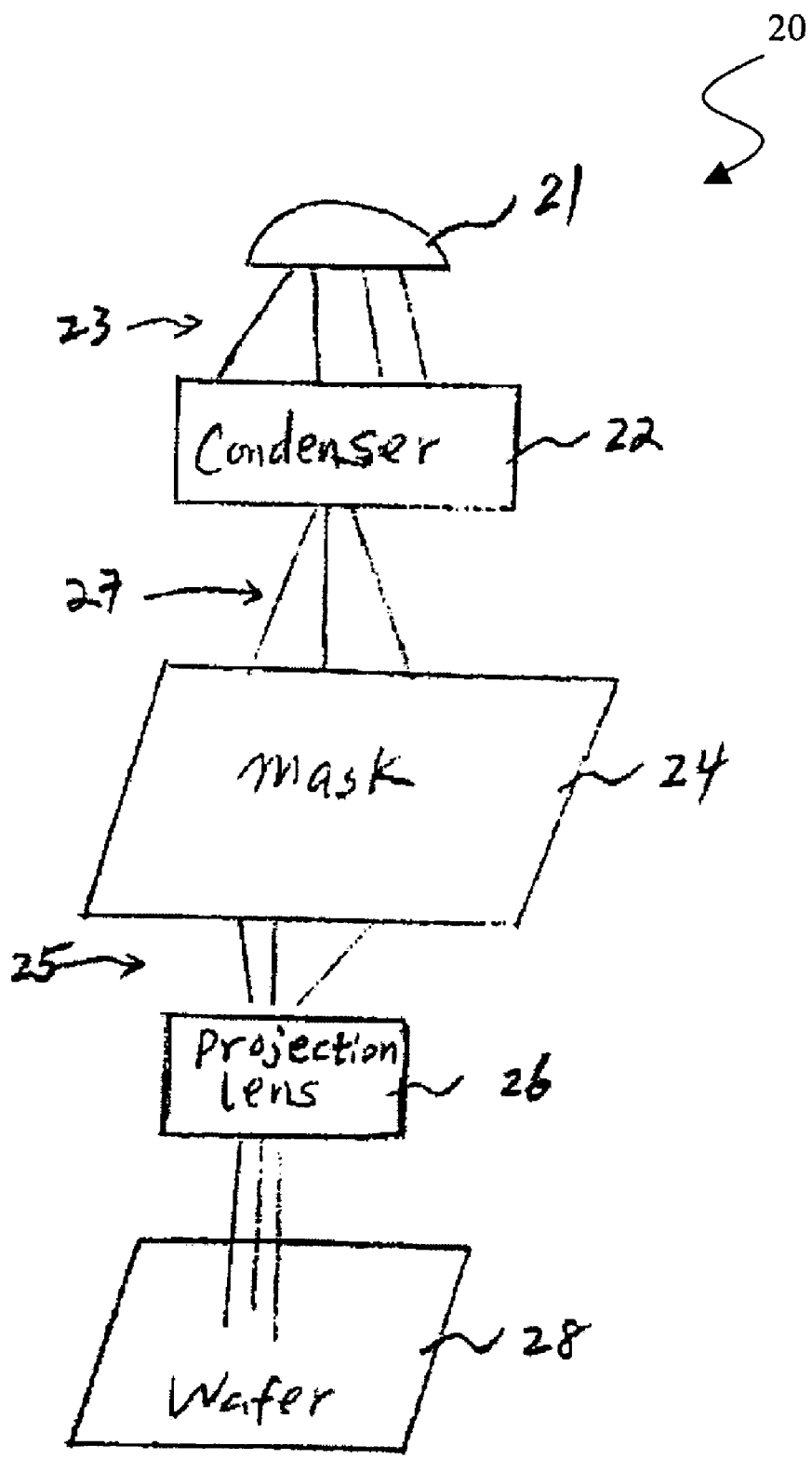
FIG. 2a illustrates a photolithography system for implementing one or more embodiments of the present invention.

Referring now to FIG. 2a, a mask 24 used in step 12 of the method 10 can be illustrated as part of a simplified exemplary lithography system. In this embodiment, a light source 21 emits light beams 23, which are condensed by a condenser 22. As a result, the mask 24, which includes patterns, is illuminated uniformly by light beams 27. After passing through the mask 24, light beams 25 are focused by a projection lens 26 prior to being projected onto a wafer 28.

Referring also to FIG. 2b, the mask 24 may be a high precision plate containing microscopic images of electronic circuits. The mask 24 may include a variety of materials, such as quartz, soda lime, white crown, and/or other materials. Generally, a layer of chrome may be included on one side of the mask 24, and electronic circuits (frequently referred to as geometry) may be etched in the chrome layer. The thickness of the mask 24 may be any suitable thickness known in the art.

In furtherance of the example, the mask 24 includes first and second focus planes 24a and 24b. The first focus plane 24a may include densely packed patterns 23a, illustrated for the sake of example as densely packed contact holes although other patterns could also be used. In one example, a contact hole 23a in the first focus plane 24a is separated from another contact hole by a distance of approximately between about 0.18 um to about 0.36 um. It is noted that other distances are also contemplated by this disclosure.

In furtherance of the example, the second focus plane 24b may include isolated patterns 23b, illustrated for the sake of example as isolated contact holes although other patterns could also be used. In one example, a contact hole 23b in the second focus plane 24b is separated from another contact hole by a distance of at least approximately 0.36 um. It is noted that other distances are also contemplated by this disclosure.

Figure 3A:
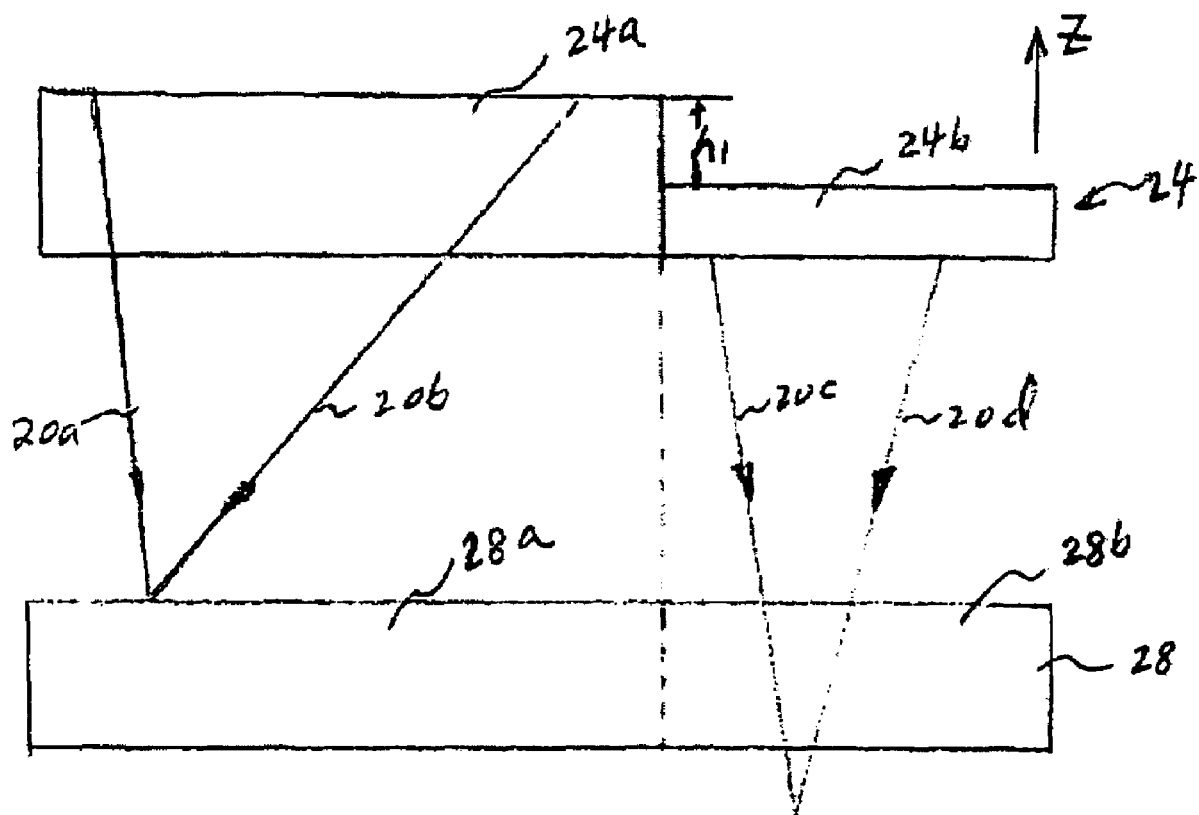
FIGS. 3a and 4a illustrate selected components of the photolithography system of FIG. 1 during intermediate stages of processing.

Referring also to FIG. 3a, in one example, the difference h1 between the first and second focus planes 24a and 24b may be approximately between about 1 um to about 10 um. However, it is noted that the difference h1 may be smaller than 1 um or larger than 10 um.

Figure 3B:
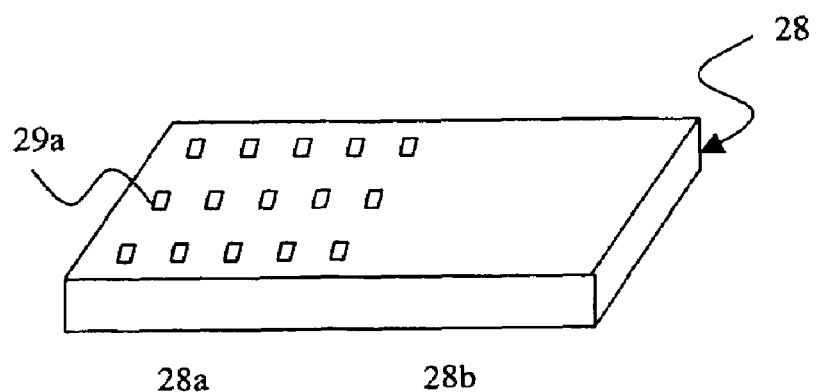
FIGS. 3b and 4b illustrated a portion of a semiconductor substrate in the intermediate stages of processing of FIGS. 3a and 3b, respectively.

Referring to FIGS. 1, 3a, and 3b, pursuant to step 14 of the method 10, a first exposure is provided with the first focus plane 24a to form a first image 29a in the first wafer region 28a. During the first exposure, the first focus plane 24a may function as a mask focus plane. In operation, light beams 20a and 20b are projected onto the wafer 28, and patterns from the first focus plane 24a may be transferred to the corresponding first wafer region 28a. It is noted that since the second focus plane 24b is defocused, light beams 20c and 20b are projected beyond the wafer 28. Accordingly, no image from the second focus plane 24b is transferred to the corresponding second wafer region 28b.

Following the first exposure, the mask 24 may be moved toward the Z direction for a distance of approximately about the difference hi or any other suitable distance, so that the second focus plane 24b may be focused for the second exposure. It is contemplated that the mask 24 may be moved by any mechanical or other suitable means.

Figure 4A:
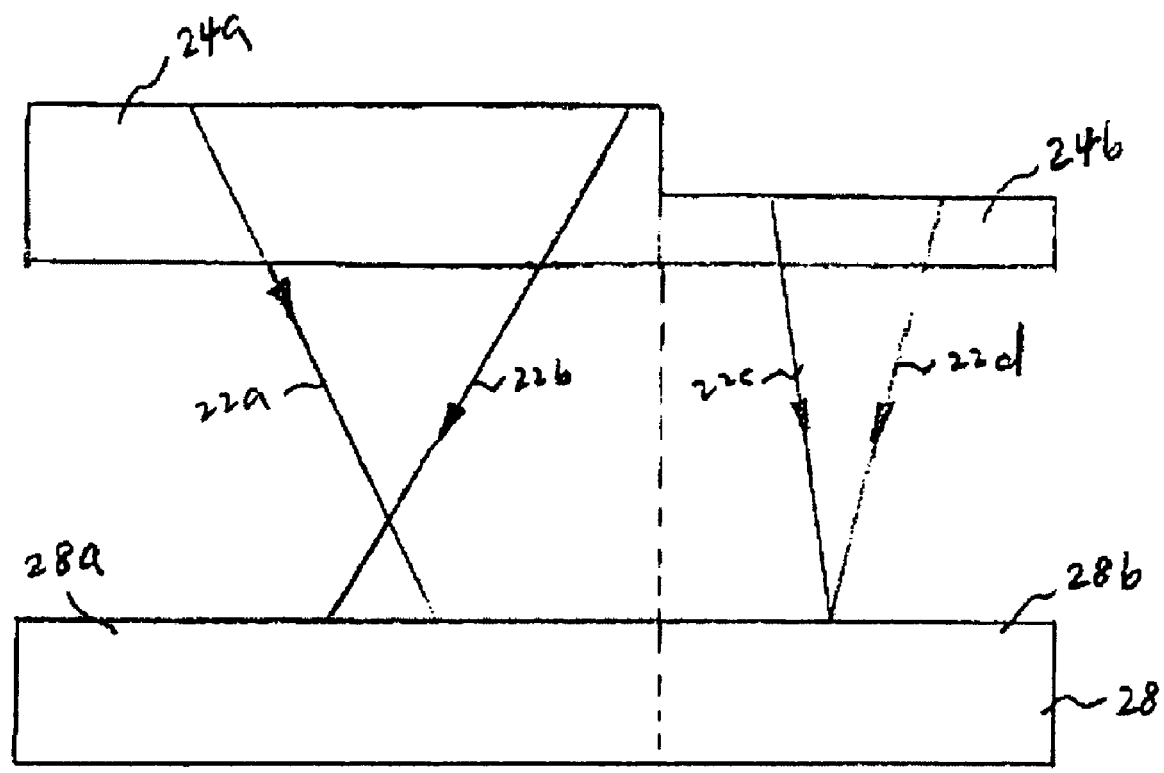
Figure 4B:
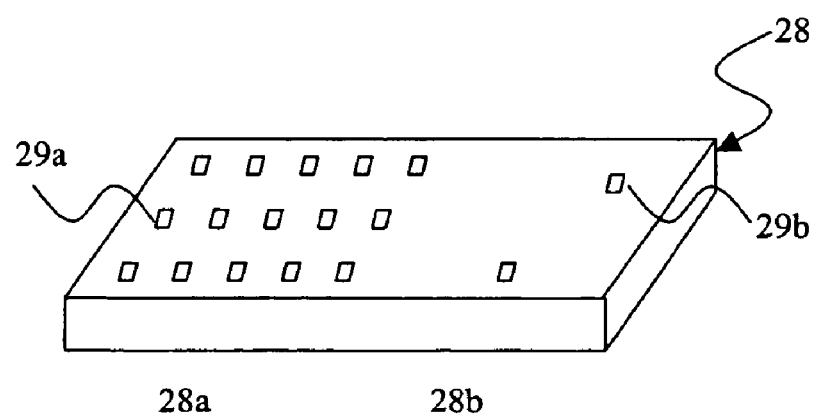

Referring now to FIGS. 1, 4a and 4b, pursuant to step 16 of the method 10, the second exposure is provided with the second focus plane 24b to form a second image 29b in the second wafer region 28b. In this embodiment, the second focus plane 24b may now function as a mask focus plane. Accordingly, light beams 22c and 22d are projected onto the wafer 28, and patterns from the second focus plane 24b may be transferred to the corresponding second wafer region 28b. It is noted that since the first focus plane 24a is defocused, light beams 22a and 22c are projected prior to reaching the wafer 28. Accordingly, no image from the first focus plane 24a is transferred to the corresponding first wafer region 28a.

Figure 5A:
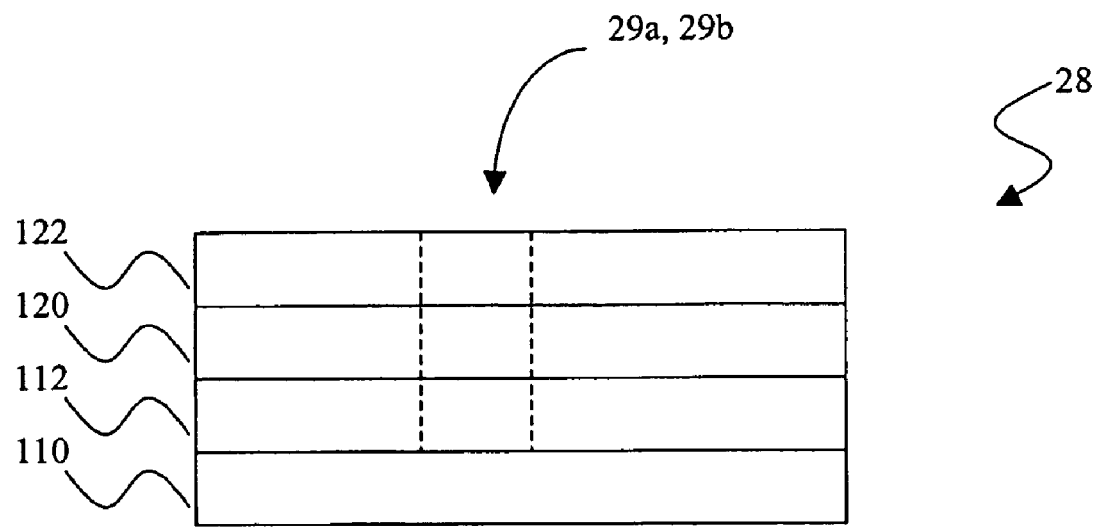
FIGS. 5a and 5b illustrate cross-sectional views of portions of the semiconductor substrate of FIGS. 3b and 4b.
Figure 5B:
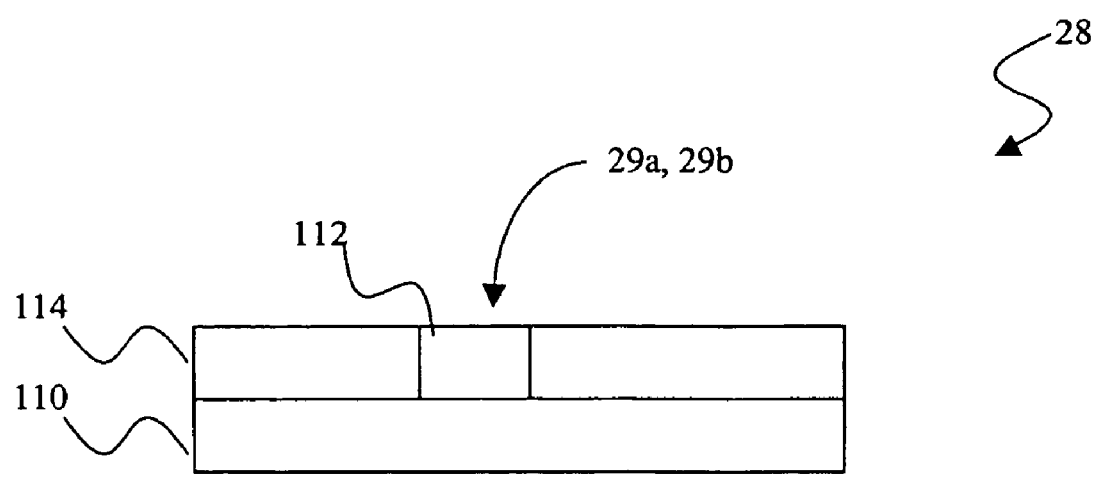

Referring now to FIGS. 5a and 5b, for the sake of example, the wafer 28 is shown in a state prior to the method 10 (FIG. 5a) and after completion of the method 10 (FIG. 5b. The wafer 28 includes a substrate 110, a conductive layer 112, a dielectric layer 114, an anti-reflective coating (ARC) layer 120, and a photoresist layer 122.

The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

The conductive layer 112 may be deposited by chemical vapor deposition (CVD), plasma-enhanced CVD (PECVD), physical vapor deposition (PVD), ionized PVD (I-PVD), atomic layer deposition (ALD), plating, and/or other processes. Chemical-mechanical planarization and/or chemical-mechanical polishing may also be employed during the formation of the conductive layer 112. A depth of the conductive layer 112 may range between about 1500 Å and about 5000 Å. For example, in one embodiment, the depth may be about 3500 Å. The conductive layer 112 may include aluminum, aluminum alloy, copper, copper alloy, tungsten, and/or other conductive materials.

The ARC layer 120 may be deposited over the conductive layer 112 by a variety of techniques, including but not limited to spin-on coating, PVD, CVD, and/or other processes.

In one example, the ARC layer 120 may absorb the light that inadvertently penetrates the bottom of the photoresist layer 122. To perform the light absorption, the ARC layer 120 may include a material with a high extinction coefficient, and/or considerable thickness. On the other hand, a high coefficient of the ARC layer 120 may lead to the high reflectivity of the ARC layer 120, which counters the effectiveness of the ARC layer. Accordingly, it is contemplated that the ARC layer 120 may possess a coefficient value at approximately between about 0.2 to about 0.5, and may possess a thickness of about 200 nm. However, it is noted that other ranges of coefficient values and thickness are also contemplated by the present disclosure.

Additionally or alternatively, an index matching approach may be adopted for the ARC layer 120. In that case, the ARC layer 120 may include a material with a refraction index and thickness that match those of the light. In operation, once the light strikes the ARC layer 120, a portion of the light is reflected therefrom. Meanwhile, another portion of the light enters the ARC layer 120 and is transformed into a light with a shifted phase, which interferes with the first portion of the light that is reflected from the ARC layer 120, resulting in the reduction of the light reflectivity.

It is contemplated that the ARC layer 120 may employ both the light absorption and index matching approaches to achieve the desired results. In some instances, the ARC layer 120 may simply remain over the dielectric layer 114 and serve as a diffusion barrier for the wafer 28, as the removal of the ARC layer 120 may be difficult to accomplish.

In furtherance of the example, the photoresist layer 122 may be deposited over the ARC layer 120. The photoresist layer 122 may be formed by spin-on coating and/or other processes. In operation, a photoresist solution is dispensed onto the surface of the ARC layer 120, and the wafer 28 is spun rapidly until the photoresist solution is almost dry. In one example, the photoresist layer 122 may be a chemically amplified resist that employs acid catalysis. In that case, the photoresist layer may be formulated by dissolving an acid sensitive polymer in a casting solution.

Following the deposition of the photoresist layer, the wafer 28 may undergo soft bake, and a double exposure process pursuant to the method 10 (described above).

Referring specifically to FIG. 5b, the dielectric layer 114 may be deposited over the surface of the substrate 110 and around the conductive layer 112 after the features have been patterned in the conductive layer and the top layers (e.g., the ARC layer 120 and the photoresist 122) have been removed. The dielectric layer 114 may be formed by CVD, PECVD, ALD, PVD, HDP, spin-on coating and/or other processes. The dielectric layer 114 may be an inter-metal dielectric (IMD), and may include high-k materials, low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials. The dielectric layer 114 may be further processed, such as being planarized.

Thereafter, additional steps are adopted for forming a complete semiconductor device. Since those additional steps are known in the art, they will not be further described herein.

Figure 6:
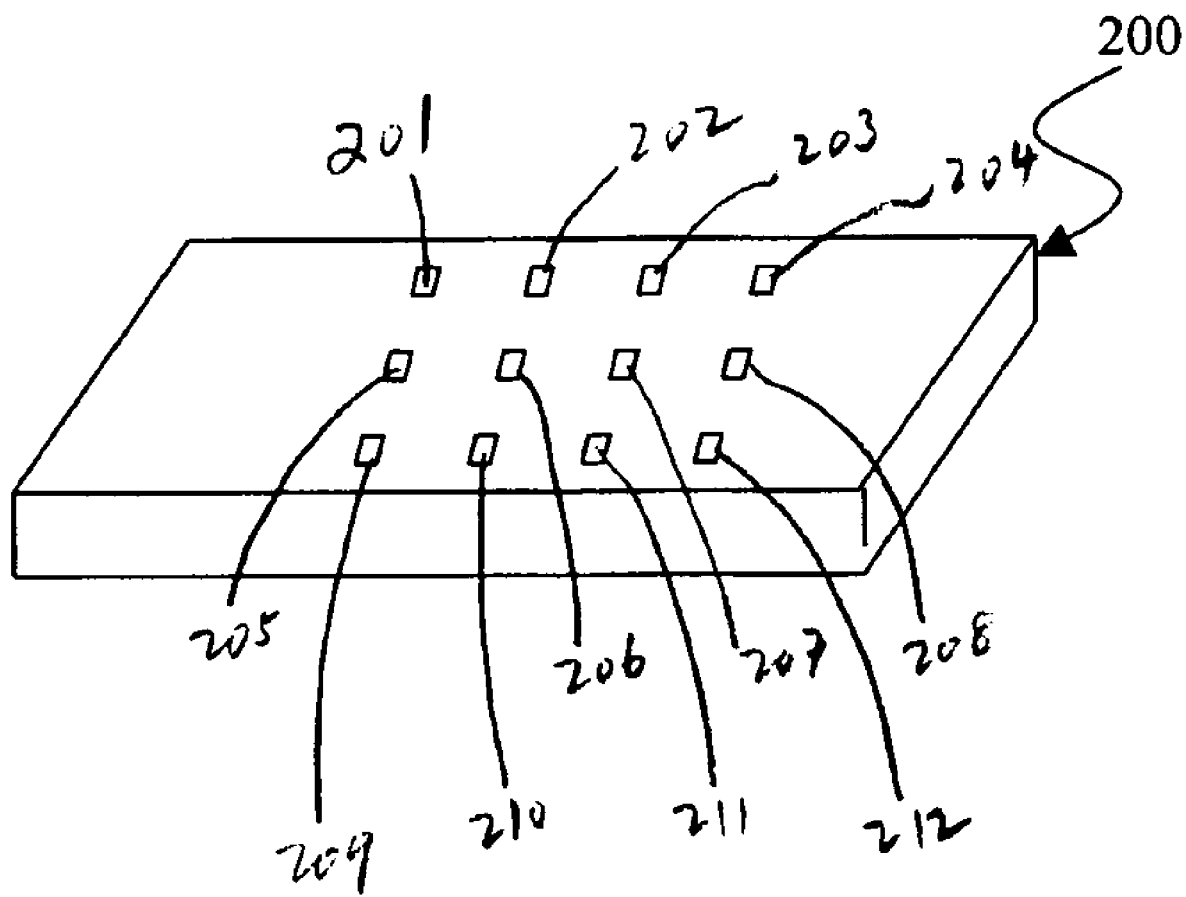
FIG. 6 illustrates a portion of a semiconductor substrate for implementing one or more embodiments of the present invention.

It is noted that many variations of the above example are contemplated herein. In one example, instead of two focus planes 24a and 24b, the mask 24 may include at least three focus planes for at least three separate exposures. In a second example, the mask 24 may include at least three focus planes for one or more exposures. In a third example, two or more of the focus planes may be focused simultaneously during one exposure. In a fourth example, the first focus plane 24a may include isolated patterns, while the second focus plane 24b may include densely packed patterns. In a fifth example, instead of moving the mask 24 toward the Z direction following the first exposure, light beams may be adjusted for the second exposure. In a sixth example, the method 10 may be applied to line patterns (for example, a dense set of lines may be formed during a first exposure process, while at least one isolated line may be formed during a second exposure process). In a seventh example and referring now to FIG. 6, the method 10 may be applied to dense patterns for the substrate 200. In one embodiment, some selected patterns may be formed during a first exposure process, while the remaining patterns may be formed during a second exposure process. In one example, patterns marked by odd numbers (201, 203, 205, 207, 209, and 211) may be formed during a first exposure process, while patterns marked by even numbers (202, 204, 206, 208, 210 and 212) may be formed during a second exposure process. In addition, the method 10 can be used as part of a non-damascene, damascene or dual-damascene process. Therefore, a variety of modifications is contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for photolithography in semiconductor manufacturing, comprising: providing a mask with a first dense mask pattern focus plane and a second isolated mask pattern focus plane wherein the first dense mask pattern and second isolated mask pattern focus planes are different;

using the mask to perform a first exposure on a first area of a surface of a wafer to form a first image, wherein the first dense mask pattern focus plane is focused to the wafer during the exposure; and using the mask to perform a second exposure on a second area of a surface of a wafer to form a second image, wherein the second isolated mask pattern focus plane is focused during the second exposure, and wherein the first and second areas of the surface of the wafer are coplanar.

2. The method of claim 1 wherein the second mask focus plane is defocused during the first exposure.

3. The method of claim 1 wherein no image is formed on the wafer from the second mask focus plane during the first exposure.

4. The method of claim 1 wherein the first mask focus plane is defocused during the second exposure focus.

5. The method of claim 1 wherein no image is formed on the wafer from the first mask focus plane during the second exposure.

6. The method of claim 1 wherein the first image comprises dense patterns, and wherein the second image comprises isolated patterns.

7. The method of claim 1 wherein the first image comprises at least one dense contact hole pattern.

8. The method of claim 1 wherein the second image comprises at least one isolated contact hole.

9. The method of claim 1 wherein the first mask focus is spaced between approximately 1 um and about 10 um from the second mask focus plane.

10. The method of claim 1 further comprising adjusting the mask toward a direction perpendicular to the first mask focus plane following the first exposure.

11. A mask for use in a photolithography system, comprising: a first dense mask pattern focus plane for providing a first image onto a first region of a wafer surface, wherein the first dense mask pattern focus plane coincides with a first surface of the mask, wherein the first image has a first pattern density; and a second isolated mask pattern focus plane for providing a second image onto a second region of the wafer surface, wherein the second isolated mask pattern focus plane coincides with a second surface of the mask, the second isolated mask pattern focus plane being non-coplanar with the first dense mask pattern focus plane, wherein the second image has a second pattern density less than the first pattern density, and wherein the first and second regions of the wafer surface are coplanar.

12. The mask of claim 11 wherein the first and second focus planes are configured so that during a first exposure, the first focus plane is focused and the second focus plane is defocused.

13. The mask of claim 12 wherein the first and second focus planes are configured so that no image is formed from the second image during the first exposure.

14. The mask of claim 12 wherein the first and second focus planes are configured so that during a second exposure, the second focus plane is focused and the first focus plane is defocused.

15. The mask of claim 14 wherein the first and second focus planes are configured so that no image is formed from the first image during the second exposure.

16. The mask of claim 11 wherein the first image comprises at least one dense set of contact holes.

17. The mask of claim 11 wherein the second image comprises at least one isolated contact hole.

18. The mask of claim 11 wherein the first image comprises at least one dense set of lines.

19. The mask of claim 11 wherein the second image comprises at least one isolated line.

20. A method for photolithography in semiconductor manufacturing, comprising:
providing a mask with a dense hole focus plane and an isolated hole focus plane wherein the dense hole focus plane and the isolated hole focus plane are located on the mask, and wherein the dense hole focus plane and the isolated hole focus plane are different;
exposing a wafer with a focus on the dense hole focus plane to form a plurality of dense hole images in a first wafer region;
adjusting the mask to focus light on the isolated hole focus plane; and
exposing the wafer with a focus on the isolated hole focus plane to form at least one isolated hole image in a second wafer region.

21. The method of claim 20 wherein the isolated hole focus plane is defocused during the exposure with a focus on the dense hole focus plane.

22. The method of claim 20 wherein no image is formed in the second wafer region during the exposure with a focus on the dense hole focus plane.

23. The method of claim 20 wherein the dense hole focus plane is defocused during the exposure with a focus on the isolated hole focus plane.

24. The method of claim 20 wherein no image is formed in the first wafer region during the exposure with a focus on the isolated hole focus plane.

\* \* \* \* \*